(12) United States Patent
Moore et al.

(10) Patent No.: US 8,212,456 B1
(45) Date of Patent: Jul. 3, 2012

(54) METHOD OF MAKING AND CERAMIC ARTICLES WITH MULTIPLE REGIONS OF DISTINCT DENSITY

(75) Inventors: Roger H. Moore, Albuquerque, NM (US); Michael A. Hutchinson, Albuquerque, NM (US); Ted V. Montoya, Albuquerque, NM (US); Thomas L. Spindle, Jr., Edgewood, NM (US)

(73) Assignee: Sandia Corporation, Albuquerque, NM (US)

( * ) Notice: Subject to any disclaimer, the term of this patent is extended or adjusted under 35 U.S.C. 154(b) by 429 days.

(21) Appl. No.: 12/543,540

(22) Filed: Aug. 19, 2009

(51) Int. Cl.
*H01L 41/187* (2006.01)

(52) U.S. Cl. ............ 310/358; 252/62.9 PZ; 252/62.9 R; 310/357; 310/339; 310/311

(58) Field of Classification Search .................. 310/339, 310/329, 338, 328, 311, 358, 357; 252/62.9 PZ, 252/62.9 R; 501/134; *H01L 41/187*
See application file for complete search history.

(56) References Cited

U.S. PATENT DOCUMENTS

| | | | |
|---|---|---|---|
| 3,999,445 A * | 12/1976 | Liautaud ................. | 29/893.3 |
| 4,090,448 A | 5/1978 | Rose et al. | |
| 4,683,161 A | 7/1987 | Rice et al. | |
| 5,928,583 A | 7/1999 | McClellan et al. | |
| 6,245,698 B1 | 6/2001 | Pope et al. | |
| 8,008,843 B2 * | 8/2011 | Baird et al. ................. | 310/339 |
| 2007/0000376 A1 | 1/2007 | Calico et al. | |
| 2009/0152989 A1 * | 6/2009 | Baird et al. ................. | 310/339 |

OTHER PUBLICATIONS

Zeng, T., et al., "Pressure-induced ferroelectric to antiferroelectric phase transformation in porous PZT 95/5 ceramics", phys. stat. sol. (a) 204, No. 4, 1216-1220 (2007).
Yang, P., et al., "Chem-Prep PZT 95/5 for Neutron Generator Applications: The Effect of Pore former Type and Density on the Depoling Behavior of Chemically Prepared PZT 95/5 Ceramics", SAND2003-3886, Oct. 2003, a Sandia National Laboratories Report.
Setchell, R.E., et al., "Dynamic Electromechanical characterization of the Ferroelectric Ceramic PZT 95/5", SAND97-2458, Oct. 1997, a Sandia National Laboratories Report.
Shkuratov, S. I., et al., "Completely explosive ultracompact high-voltage nanosecond pulse-generating system", Rev. of Sci. Instr. 77, 043904, 2006.
Shkuratov, S. I., et al., "Completely Explosive Autonomous High-Voltage Pulsed-power System Based on Shockwave Ferromagnetic Primary Power Source and Spiral Vector Inversion Generator", IEEE Trans. on Plasma Sci., vol. 34, No. 5, Oct. 2006.
Gunderson, M., "Applications for Compact Portable Pulsed Power: rocket Science, Cancer Therapy and the Movies", Proceedings of the 27th International Power Modulator Symposium, 2006.
Shkuratov, S. I., et al., "Compact Explosive-Driven Generator of Primary Power Based on a Longitudinal Shock Wave Demagnetization of Hard Ferri- and Ferromagnets", IEEE Trans. on Plasma Sci., vol. 30, No. 5, Oct. 2002.

(Continued)

*Primary Examiner* — Thomas Dougherty
*Assistant Examiner* — Karen B Addison
(74) *Attorney, Agent, or Firm* — Lowell Carson

(57) ABSTRACT

A method for producing ceramic articles with multiple distinct regions of density by blending pore formers of different types or amounts with ceramic particles to create multiple pore former/ceramic particle mixtures. The mixtures are placed in a divided die cavity, divider removed and subjected to compaction under pressure to produce a compacted billet. The compacted billet is thermally processed to volatilize organics from the billet and sinter the billet, creating a cohesive billet of ceramic having two or more regions of density.

10 Claims, 2 Drawing Sheets

OTHER PUBLICATIONS

Kristiansen, M., "Compact Pulsed Power and High Power Microwave Devices", Final Report, Air Force Office of Scientific Research, Grant No. F49620-00-1-0221, Sep. 2003.

Tkach, Y., et al., "Theoretical Treatment of Explosive-Driven Ferroelectric Generators", IEEE Trans. on Plasma Sci., vol. 30, No. 5, Oct. 2002.

* cited by examiner

METHOD OF MAKING AND CERAMIC ARTICLES WITH MULTIPLE REGIONS OF DISTINCT DENSITY

STATEMENT REGARDING FEDERALLY SPONSORED RESEARCH OR DEVELOPMENT

The United States Government has certain rights in this invention pursuant to Department of Energy Contract No. DE-AC04-94AL85000 with Sandia Corporation.

FIELD OF THE INVENTION

The invention generally relates to methods of making and ceramic articles having multiple distinct regions of pore morphology. The invention further relates to ferroelectric elements for shock driven pulsed power supplies that have multiple distinct regions of pore morphology and operate effectively at elevated operating temperature.

BACKGROUND OF THE INVENTION

Compact portable pulsed power generators (i.e. power sources) are either currently utilized or desired for a wide variety of applications including flame initiation and detonation in pulse detonation engines (PDE) for high speed aircraft, biomedical research into the pulsed electric field treatment of cancerous cells, ultra-wideband (UWB) and high power microwave (HPM) directed energy devices, free electron lasers, x-ray imaging devices and kinetic energy launchers such as railguns. Pulsed power generators can be generally categorized as either repetitive use or single use. Repetitive use pulse power generators can include capacitively driven generators while single use generators can include explosively driven (i.e. shock driven) generators. Examples of explosively driven pulsed power generators include magnetocumulative (MCG) generators and generators based upon the explosive compression of ferroelectric materials.

The present invention relates to compact, shock-driven (e.g. explosively compressed) ferroelectric pulsed power supplies that can produce high voltage and current outputs over short time durations. Applications for shock-driven ferroelectric power supplies can require compact power sources operating at elevated temperatures, which typically degrade the performance of currently available shock-driven ferroelectric power supplies. This degradation of performance at elevated temperatures can manifest itself as a lowering of the electrical output of the ferroelectric elements, within a ferroelectric pulsed power supply. The methods of the present invention overcome this limitation by providing ferroelectric elements for shock driven power supplies with increased electrical output at elevated temperatures without compromising high voltage breakdown resistance at lower temperatures. In embodiments of the invention, this can be accomplished by producing ferroelectric ceramic elements having multiple distinct regions of pore morphology and therefore multiple distinct regions of density (e.g. mass per unit volume).

BRIEF DESCRIPTION OF THE DRAWINGS

The accompanying drawings, which are incorporated in and form part of the specification, illustrate embodiments of the present invention and, together with the description, serve to explain the principles of the invention.

DETAILED DESCRIPTION OF THE INVENTION

Lead zirconate titanate (PZT) is a common material used to fabricate ferroelectric elements for shock-driven, ferroelectric pulsed power supplies. During the fabrication of PZT ceramic elements, fugitive materials, i.e. pore formers, can be added to control the final sintered density (d) of the ceramic component. PZT, if allowed to sinter completely (i.e. achieve near theoretical density) has been found to be susceptible to premature failure by the high voltage breakdown mechanism, when used in shock driven power supplies. However, the addition of organic-based materials that will combust during the sintering process and leave behind sufficiently large voids of a substantially uniform dispersion (i.e. thereby reducing the final sintered density) has been found to render improved performance capability to the ceramic elements, and reduce the likelihood of a failure by high voltage breakdown. Several types of pore formers have been shown to improve the performance of these materials. Each of the pore formers are unique in their size and shape, and impart specific advantages to the ceramic elements. In order to maximize element performance, it may be desirable to combine various pore formers in order to achieve the best properties from each type of pore former. Earlier attempts at combining pore formers focused on blending different pore formers together prior to adding them to a ceramic powder followed by compaction and sintering to final density. This resulted in a blended void morphology with no clear advantage over using a single pore former.

The present invention can be applied to produce ceramic articles having two or more distinct regions having different densities and/or pore size and shape morphologies, from compaction of pre-sintered pore-former and ceramic powder blends containing different pore formers, or different levels of the same pore former, or combinations thereof. By the methods of the present invention, the bulk density and void morphology can be controlled and varied to produce distinct regions within the ceramic (e.g. PZT) element. With this technique, the characteristics and performance of each distinct region within the element can be tailored to obtain overall performance goals. In particular as discussed below, the methods of the present invention can be used to obtain ferroelectric elements having multiple distinct regions of porosity (e.g. density) that achieve improved operating performance, for example as exhibited by an increased electrical output.

Figure 1:
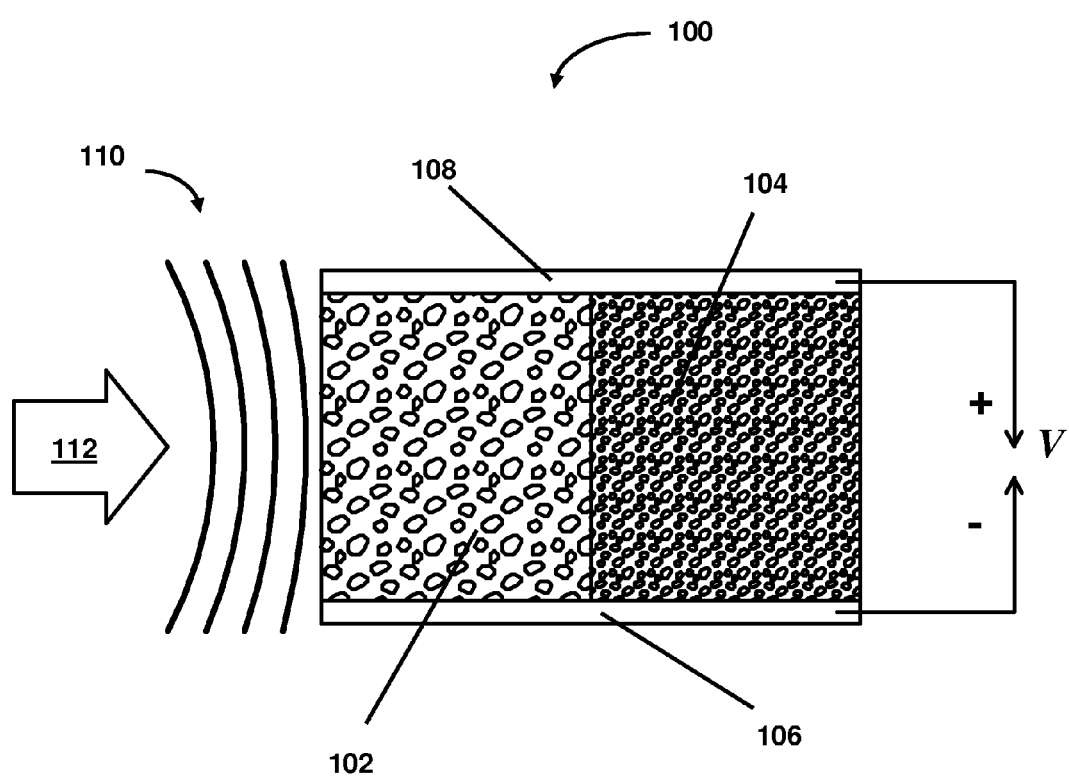
FIG. 1 is a schematic illustration of an embodiment of a ceramic article having multiple distinct regions of pore morphology, according to the present invention.

FIG. 1 is a schematic illustration of an embodiment of a ceramic article having multiple distinct regions of density, (e.g. pore morphology) according to the present invention. In this example, a PZT billet 100 was formed from a compacted blank having two distinct pore former/void regions, a lower density region 102 and a higher density region 104 ($d_{102}<d_{104}$) here shown having electrodes 106 and 108. The pore formers were segregated within the billet 100 to produce separate regions with different pore morphologies. In a typical application a shock wave 110 from the detonation of an energetic material 112 (e.g. explosive) is directed to an end of the PZT billet 100 and travels through the length of the billet 100 producing a pulsed current output that can be applied to a load. FIG. 1 illustrates an example of transverse wave shock driven ferroelectric elements. The principles of the invention can be applied to longitudinal wave shock driven ferroelectric elements as well (e.g. shock wave travels perpendicular to electrodes).

The principles of shock driven ferroelectric pulsed power supplies are described elsewhere and for brevity, are not reproduced here. See for example; Yaroslav Tkach, et al., "Theoretical Treatment of Explosive-Driven Ferroelectric Generators", IEEE Transactions on Plasma Science, Vol. 30, No. 5, October 2002 and, U.S. Patent Application No. US2007/0000376 by Calico et al., published Jan. 4, 2007, the contents of each of which are herein incorporated by reference in their entirety.

As the shock wave 110 traverses the length of the PZT billet 100, PZT material acted upon by the shock wave depolarizes, releasing charge and developing a high voltage potential V across electrodes 106 and 108. This charge (i.e. energy) can then be applied to a load. In practice, it has been found that high voltage breakdowns can occur near the front of the shockwave and through the PZT material, causing the output voltage V to fall before the shockwave has traveled down the entire length of the billet, preventing a generator from producing peak output. To mitigate this failure, pore formers are added to reduce the overall density of the billet. While effective in reducing the failure rate, the pore formers also reduce the electrical output, as the electrical output is directly proportional to density. It has also been observed that the electrical output is inversely proportional to the test unit temperature as the ferroelectric PZT has reduced charge storage capacity at elevated temperatures. The methods of the present invention produce a continuous billet 100 having a lower density portion 102 (i.e. at least one) near the shock impingement end of the billet and a higher density portion 104 away from the shock driven end of the billet (such as illustrated in FIG. 1). Ferroelectric elements produced by the methods of the present invention have been found to exhibit a greatly increased electrical output. For conventional ceramic elements with only a single uniform density, it has been observed that high voltage breakdown tends to occur more frequently at cold temperatures (i.e. sub-ambient temperatures). However, ferroelectric elements produced by the methods of the present invention while demonstrating increased electrical output, do not prematurely fail by high voltage breakdown regardless of the test temperature.

Fabrication of ceramic articles by compaction and sintering of ceramic powders has been described elsewhere and for brevity, are not reproduced here. See for example U.S. Pat. No. 5,928,583 to McClellan et al., herein incorporated by reference in its entirety.

Figure 2:
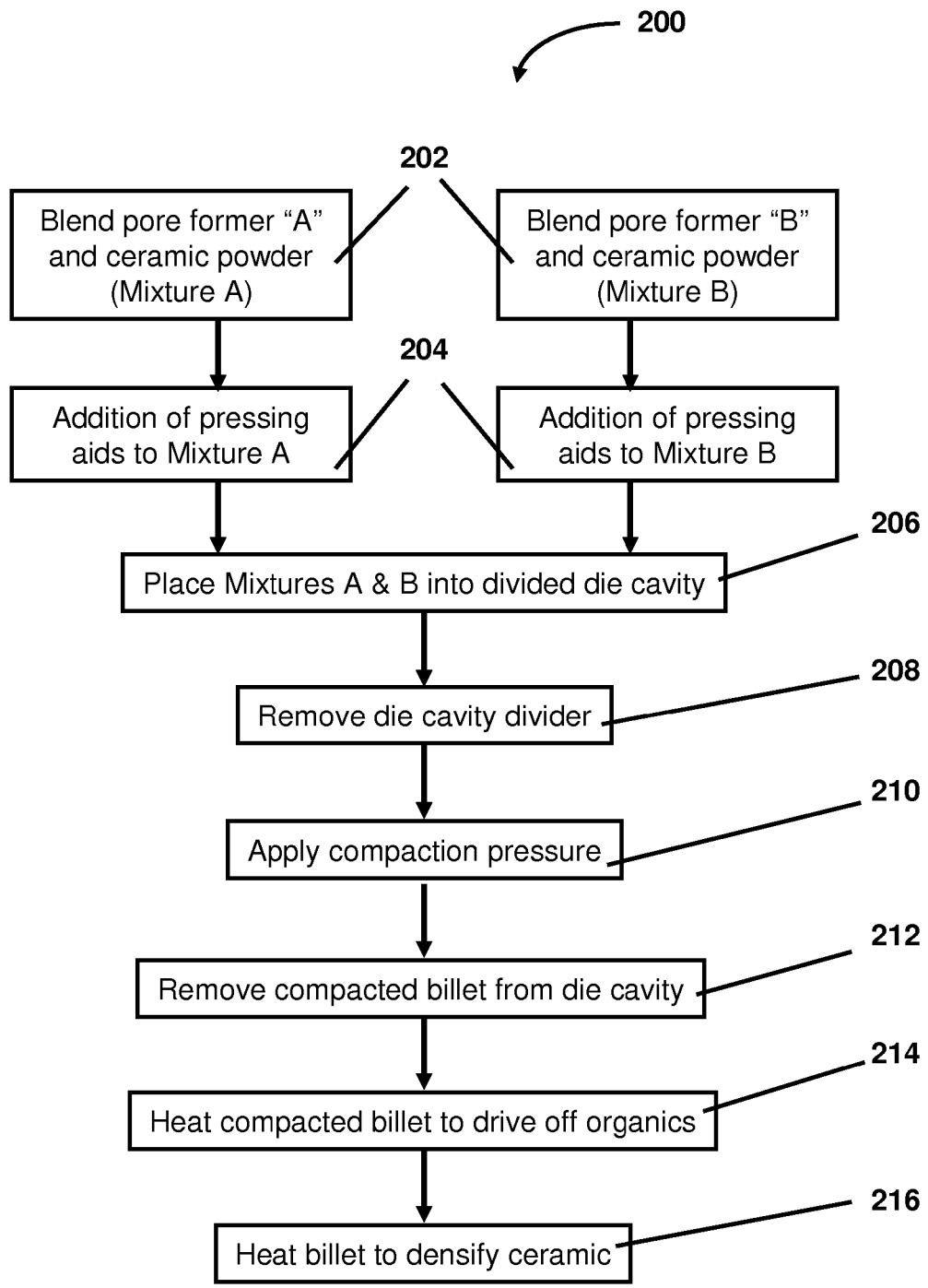
FIG. 2 is a schematic flow chart of an embodiment of a method for making a ceramic article having multiple distinct regions of density, according to the present invention.

FIG. 2 is a schematic flow chart of an embodiment of a method for making a ceramic article having multiple distinct regions of density, according to the present invention. The exemplary ferroelectric element 100 was fabricated using uniaxial powder compaction techniques. Other compaction techniques can be employed as well. The embodiment of the method 200 begins at step 202 where blending of a first pore former "A" into a PZT ceramic powder to create mixture "A", and blending of a second pore former "B" into a PZT ceramic powder to create mixture "B", one powder/pore former blend for each of the two distinct regions in the eventual ferroelectric element. The present invention employed two different pore formers-polymethylmethacrylate and microcrystalline cellulose. The polymethylmethacrylate (Transoptic powder, Buehler Ltd., Lake Bluff, Ill.) is commonly referred to as "lucite" and is a spherical particle with a diameter distribution range of 20 to 120 μm. The microcrystalline cellulose (Avicel PH 105, FMC Corp., Newark, Del.) is commonly referred to as "avicel" and possesses an irregular, plate-like, shape with lengths up to 80 μm and widths, or thicknesses, of 20 to 50 μm. The PZT powder has a nominal composition of $Pb_{0.99}(Zr_{0.95}Ti_{0.05})_{0.98}Nb_{0.02}O_3$ with an average particle size of 5 μm. Approximately 0.1 weight percent lucite pore former is blended with the PZT powder to form mixture "A". The two powders are blended to form the mixture by using a twin shell blender (Patterson Kelly Co Inc, E. Stoudsburg, Pa.) for approximately 3 minutes. For powder mixture "B", approximately 1.2 weight percent avicel pore former is blended with the PZT powder using the same blending process.

At step 204 following ceramic powder and pore former blending, an aqueous acrylic emulsion binder (Glascol HA4, Ciba Specialty Chemicals, Tarrytown, N.Y.) pressing aid can be added to the mixtures A and B. Approximately 2 weight percent of the binder is added using the twin shell blender and blending for approximately 10 minutes. Additions are made to both mixture A and mixture B.

At step 206, mixtures A and B are placed into a compaction die cavity that is divided into two separate regions by a removable divider. The divider defines the boundary between the eventual distinct regions (e.g. 102 and 104). The die cavity could be separated into more than two regions, and more than two powder mixtures used as well.

At step 208, the die cavity divider is removed, and at step 210 die punches are inserted and pressure is applied to the ceramic powders within the die to form a compacted billet. The compacted billet is removed from the die at step 212 and sent on for thermal treatment.

At step 214 the compacted billet is heated to cause the organic materials (e.g. pore formers, compaction aids, binders) to be vaporized (e.g. burnt out) of the billet.

At step 216 the billet is heated to elevated temperatures to effect sintering of the ceramic particles comprising the powders into a cohesive structure; the two distinct regions are co-sintered into one continuous structure. The process is complete to form the ferroelectric element having two distinct regions of density. For convenience, steps 214 and 216 can be accomplished as one thermal treatment step.

An exemplary PZT billet as illustrated in FIG. 1 was formed according to the methods of the present invention having two distinct regions of 7.66 and 7.52 g/cm$^3$ densities (e.g. approximately 7.7 and 7.5 g/cc) with spherical and plate-like pore morphologies respectively, and pore sizes ranging from 5 to 120 μm. It is to be noted that the boundary between the two regions is distinct and continuous without cracking or deformation, and can be viewed by low power optical inspection. Subsequent conventional ceramic grinding operations were then used to produce the ferroelectric elements in final dimension for testing.

During explosive functional testing of components produced by the methods of the invention, the shock wave generated by an explosive pellet releases the bound electrical charge from the ferroelectric ceramic element. Electrical current generated is directly proportional to the bulk density of the ceramic sample. Since these samples contained two distinct density regions, the current level varied as a function of the bulk density within the regions. By orienting the lower density region of the ceramic element closest to the explosive charge, the component will generate relatively more current when the shock wave passes from the lower density region into the higher density region. This current increase can compensate for losses in output due to testing at elevated temperatures, or losses associated with shock wave attenuation as the wave travels through the component. Orienting the lower density region of the ceramic element closest to the explosive charge also prevents failure by high voltage breakdown even under the most demanding cold temperature test conditions. The opposite orientation (i.e. with the higher density region closest to the explosive charge) produces the opposite effect in that the current output will decrease proportionately when the shock wave passes from the higher density region to the lower density region and increases the probably of failure by high voltage breakdown.

The above described exemplary embodiments present several variants of the invention but do not limit the scope of the invention. For example, while the principles of the invention have been described in light of producing ferroelectric ceramics having distinct regions of pore size, pore morphology and density, the principles can in general be applied to fabrication of ceramic articles of other chemical compositions. Additionally, while the invention has been described in producing a ceramic article with two distinct regions of density, the invention is not limited to just two distinct regions as those in the art will understand the only limitation to the number of distinct regions is determined by the configuration of the die cavity(s) used in compaction. Those skilled in the art will appreciate that the present invention can be implemented in other equivalent ways. The actual scope of the invention is intended to be defined in the following claims.

What is claimed is:

1. A ceramic article having multiple distinct regions of density, the article comprising:
   a first portion having a first density; and
   a second portion having a second density, the second portion adjacent to the first portion, the second portion and the first portion being co-sintered into a cohesive body, the first and second densities each being greater than zero.

2. The article of claim 1 wherein the first and second portions comprise lead zirconate titanate (PZT).

3. The article of claim 2 wherein the lead zirconate titanate (PZT) comprises approximately $Pb_{0.99}(Zr_{0.95}Ti_{0.05})_{0.98}Nb_{0.02}O_3$.

4. The article of claim 2 further comprising one or more electrodes disposed on one or more surfaces of the article.

5. The article of claim 4 wherein at least one electrode simultaneously contacts the first and second portions.

6. The article of claim 2 wherein the first density is less than the second density.

7. The article of claim 6 wherein the first density is approximately 7.5 g/cc and the second density is approximately 7.7 g/cc.

8. The article of claim 6 further comprising an energetic material, the energetic material operatively arranged to deliver a shockwave to the first portion.

9. The article of claim 2 wherein the first density is greater than the second density.

10. The article of claim 6 further comprising an energetic material, the energetic material operatively arranged to deliver a shockwave simultaneously to the first portion and the second portion.

* * * * *